United States Patent [19]

Loebe

[11] 3,973,125
[45] Aug. 3, 1976

[54] CORPUSCULAR-RAY APPARATUS WITH A CRYOGENICALLY COOLED SPECIMEN SPACE

[75] Inventor: Wolfram Loebe, Berlin, Germany

[73] Assignee: Siemens Aktiengesellschaft, Berlin and Munich, Germany

[22] Filed: June 23, 1975

[21] Appl. No.: 589,577

Related U.S. Application Data

[63] Continuation of Ser. No. 151,808, June 10, 1971, abandoned, which is a continuation of Ser. No. 577,370, Sept. 6, 1966, abandoned.

[30] Foreign Application Priority Data

Sept. 16, 1965  Germany.............................. 99446
July 8, 1966  Germany............................ 104688

[52] U.S. Cl. ............................................. 250/443
[51] Int. Cl.² ......................................... G01N 23/20
[58] Field of Search ............ 250/306, 310, 311, 443

[56] References Cited
UNITED STATES PATENTS

| | | | |
|---|---|---|---|
| 2,858,444 | 10/1958 | Leisegang ........................... | 250/443 |
| 3,124,680 | 3/1964 | Van Dorsten et al. .............. | 250/443 |
| 3,373,277 | 3/1968 | Heide................................ | 250/443 |
| 3,387,132 | 6/1968 | Herrmann et al................... | 250/443 |

*Primary Examiner*—Alfred E. Smith
*Assistant Examiner*—T. N. Grigsby
*Attorney, Agent, or Firm*—Herbert L. Lerner

[57]  ABSTRACT

In a charged particle-beam apparatus, a lens device includes a charged particle-beam lens defining a beam axis and having two centrally apertured lens members formed of magnetic material and axially spaced from each other to form a space therebetween, the apertures of the lens members defining a lens bore, specimen holder means extending axially into the lens bore for holding a specimen therein, a first cooling body situated in the space between the lens members in heat insulating relation to the lens members and extending about the axis in a plane substantially perpendicular to the latter, the first cooling body consisting of non-magnetic material and having a central opening at least substantially equal in diameter to the lens bore so that the first cooling body is prevented from protruding into the lens bore, the central opening being defined by an inner wall of the first cooling body extending axially between the lens members and circumferentially facing the specimen holder means, heat-conductive connecting means for connecting the first cooling body to a cryogenic source, whereby the surface of the first cooling body, when cooled, reduces soiling of the specimen, a second cooling body disposed above the lens, the specimen holder means having a face directed away from the lens, the second cooling body being located adjacent the face of the specimen holder means and being formed with a central opening surrounding the beam axis and having a diameter larger than the specimen holder means and at least as large as the diameter of the lens bore whereby the second cooling body is prevented from protruding into the lens bore, and a second heat-conductive connecting means attached to the second cooling body for communicating with the cryogenic source.

13 Claims, 1 Drawing Figure

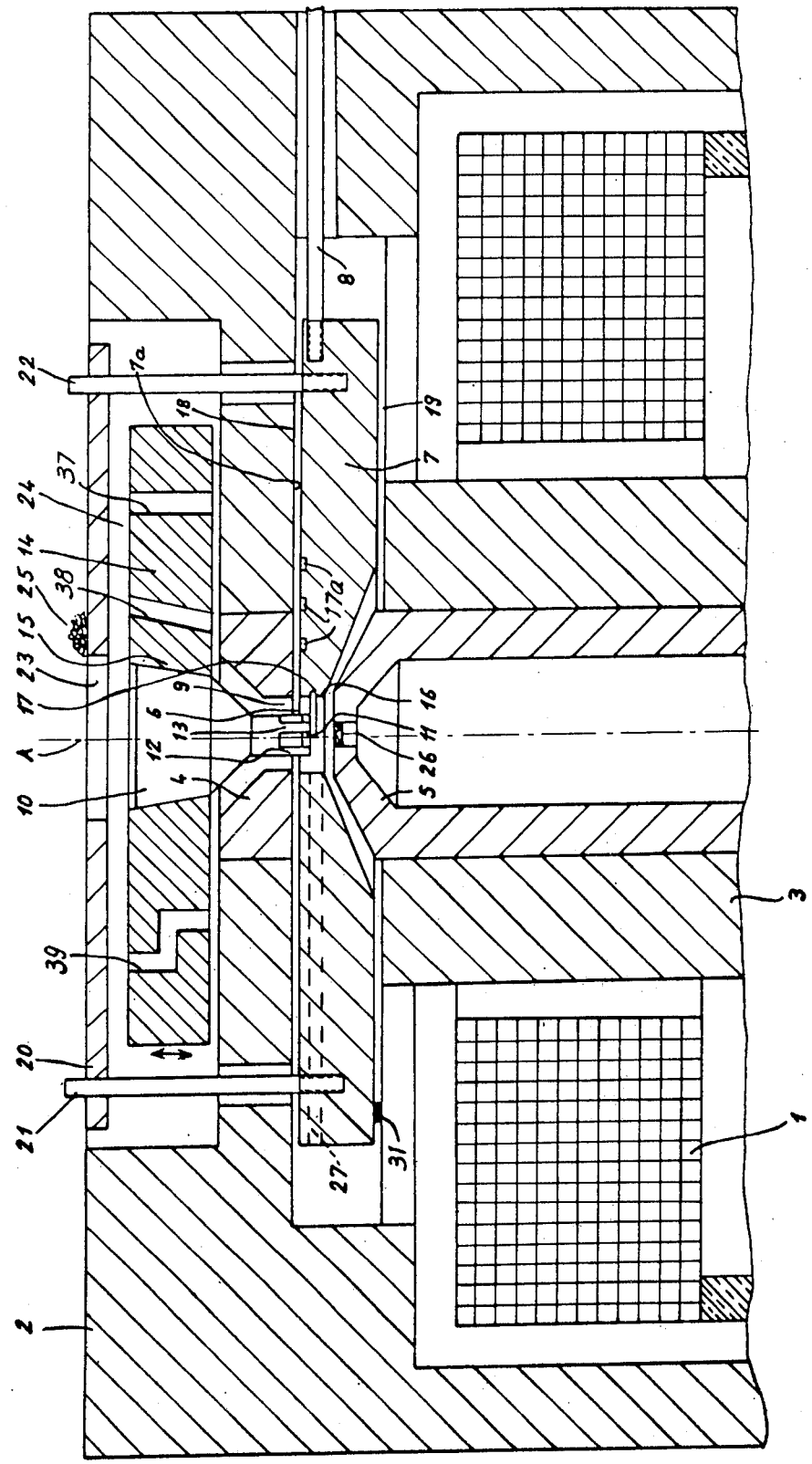

CORPUSCULAR-RAY APPARATUS WITH A CRYOGENICALLY COOLED SPECIMEN SPACE

This is a continuation of application Ser. No. 151,808, filed June 10, 1971, which is a continuation of Ser. No. 577,370, filed Sept. 6, 1966, both abandoned.

Corpuscular-ray apparatus of this type are described, for example, in my copending application Serial No. 497,894, filed Oct. 19, 1965, and now U.S. Pat. No. 3,444,365, as well as in the U.S. Pat. No. 3,387,132, of myself and K. H. Herrmann.

It is an object of the present invention to provide corpuscular-ray apparatus generally of the above-mentioned type with a device that protects the specimen from soiling with the aid of particularly simple and reliable means.

Another object of my invention is to render the cryogenic protection of a specimen from soiling effective not only in the immediate vicinity of the specimen itself but also in adjacent regions, thus improving the desired effect.

According to the invention, I provide a continuously evacuable corpuscular-ray apparatus with an annular cooling member, such as a flat ring-shaped disc, which is situated in the lens gap about the ray axis of the apparatus and whose central opening has a diameter at least substantially equal to the diameter of the lens bore into which the axially displaceable specimen holder or cartridge is to be located. The annular structure consists of a material inactive with respect to the electrical or magnetical lens field obtaining in the gap and is provided with heat-conducting means for connection to a cryogenic source, so that the interior ring face of the annular structure, during cryogenic cooling, has the above-mentioned effect of preventing soiling of any specimen inserted into the lens bore close to the cooled annular structure.

The invention departs from the heretofore prevailing principle of surrounding the specimen by a cryogenically cooled chamber requiring cooled structures to be located within the lens bore in which the specimen or the specimen cartridge is to be received. As a result, the invention permits dimensioning the lens bore exclusively for optimal electron-optical requirements in view of the desired displaceability of the specimen. This is not only favorable as regards image formation but also affords giving the lens bore a smaller diameter than otherwise required for given limits of specimen displacement.

It will be understood that the above-mentioned lens gap in which the annular cooling structure is located, is the electrical-field gap between the two axially spaced electrode members of an electrostatic lens, or by the magnetic-field gap formed between the axially spaced pole-shoe members of an electromagnetic or permanent magnetic lens.

For electron microscopes of the kind requiring the specimen to be inserted laterally, namely by displacement transverse to the electron beam axis, into the gap of the objective lens, it has become known to provide two cooled surface members spaced from each other within the lens gap in the direction of the lens axis, each of the surface members having a bore for the passage of the electron beam, the specimen being located between the two cooled members. This construction, as mentioned, is intended and applicable only for an electron microscope with an objective lens requiring lateral insertion of the specimen. In contrast thereto, the present invention concerns electron microscopes or other corpuscular-ray apparatus in which the object is inserted into the objective lens by displacement of the specimen or specimen holder in the direction of the ray axis, and hence by upward or downward movement if the apparatus has a substantially vertical axis. As far as corpuscular-ray apparatus of the latter type are concerned, the cryogenic means heretofore employed and considered necessary involve the principle of a cooled chamber within the lens structure and around the specimen.

In some cases, for example in corpuscular-ray apparatus with magnetic lenses, the lens bore sometimes possesses different regions along the lens axis in which the respective bore diameters are different. Thus, the pole shoe equipped for receiving the specimen usually has a larger bore diameter than the opposite pole shoe. In this case, the central opening of the annular cooling structure is given a diameter at least substantially equal to the largest diameter of the lens bore and consequently at least substantially equal to the bore diameter in the pole shoe that is to receive the specimen or specimen holder.

The efficacy of apparatus according to the invention depends upon the size of the cooled ring area facing the specimen, although other surface areas of the annular structure which, though near the specimen, do not directly face it, also contribute to the prevention of specimen soilage.

According to another feature of my invention, therefore, the area of the cooled annular wall formed by the annular structure and facing the specimen when the latter is inserted, is given different diameters at different localities along the ray axis, thus increasing the effective area of the cooled wall. Such a wall profile increases the area directly facing the specimen. With such a design, the smallest diameter of the opening in the annular structure should be at least substantially equal to the largest diameter of the lens bore.

In principle, the cooling structure may be mounted directly at the axially adjacent parts of the lens-forming structure, such as the pole shoe or lens electrodes, provided a suitable heat insulation is interposed. According to another feature of the invention, however, narrow gaps are left between the annular cooling structure, on the one hand, and the axially adjacent parts of the lens-forming structure, on the other hand, thus utilizing the surface areas of the cooling structure that extend in planes transverse to the ray axis for augmenting the protection from specimen soiling. This effect can be increased by giving the cross section of the annular structure at these localities a profile that increases the areas adjacent to the transverse gaps.

The vacuum in the vessel of the corpuscular-ray apparatus may still contain atoms and/or molecules of residual gases or vapors. To prevent these from reaching the vicinity of the specimen, it is preferable, according to still another feature of my invention, to provide a "warm" diaphragm, that is a not cryogenically cooled diaphragm, with a small aperture diameter, in the lens-forming member located away from the entering side of the specimen. The aperture of this diaphragm can be made very small without encountering the danger of causing astigmatism due to icing, because this diaphragm is not cooled. The diaphragm does not operate as a cooling trap, but only as a flow resistance relative to hydrocarbon atoms.

In order to expose the specimen as free as feasible to the influence of the cooling areas of the annular structure within the lens gap, it is preferable to provide the specimen cartridge or holder with legs, wires, meshwork or the like mounting means for supporting the specimen freely floating within the lens bore. With such a mounting, the cooling effect of the annular structure can virtually act upon the entire environment of the specimen without hindrance.

The annular cooling structure in the lens gap may be provided with bores extending transverse to the lens axis for receiving holding or actuating elements for diaphragms or the like, as may be required within the lens bore and preferably within the lens gap. Any gaskets or other sealing means for such holding or actuating elements are preferably mounted far away from the lens bore so that any gases or vapors issuing from the sealing means will be held back by the surfaces of the annular cooling structure.

According to still another feature of my invention, I provide a second annular cooling structure on the side of the specimen cartridge or holder facing away from the lens, the second annular structure having likewise a central opening sufficiently large to permit the passage of the specimen cartridge. In embodiments of the invention equipped with such a second cooling structure, the specimen, when in proper position, is located in a cooling arrangement constituted on one side by the first annular cooling structure located within the lens gap, preferably in conjunction with the above-mentioned uncooled diaphragm, and on the other side by the second annular cooling structure. Preferably, both annular cooling structures are made as large as possible so that they have largest feasible surface areas which may be given a profile in order to further increase the cooling surface. This takes into account the fact that in such an arrangement the specimen to be protected from soiling is spaced a relatively large distance from the cooling structures as compared with the corresponding conditions obtaining in an enclosed and cooled chamber as heretofore known. It has been found that the cooling action obtained by virtue of the invention is in no way reduced as compared with that achieved by a cooled chamber.

The second annular cooling structure may be connected with another cryogenic device, or it may be connected by additional heat-conducting connecting means with the same cryogenic source as the first annular cooling structure. It is particularly advantageous, in accordance with a preferred embodiment, to mount the second cooling structure with the aid of heat-conducting connecting members on the first annular cooling structure situated within the lens gap. This avoids the necessity of using separate means for holding and cooling the second cooling structure, and does not require additional passages through the wall of the vacuum vessel in which the corpuscular-ray apparatus is located.

If the apparatus is equipped with an adjustable table into which the specimen cartridge is inserted for the purpose of permitting displacement of the specimen cartridge in directions transverse to the ray axis, it is preferable to arrange the second annular cooling structure on the table side facing away from the lens, providing for no more than the smallest feasible interspace between the table and the second cooling structure. The larger this interspace, the greater is the possibility that atoms or molecules may reach the specimen and contribute to soiling. This is due to the fact that the suction impedance of the interspace becomes larger as the width of the interspace decreases, and that the probability of such atoms or molecules being caught by the cold surfaces of the second cooling structure will likewise increase with a decreasing size of this interspace.

If, in a corpuscular-ray apparatus with a transversely displaceable specimen table, a second annular cooling structure is mounted by heat-conducting connections upon the first annular cooling structure located within the lens gap, the connecting elements are to be distributed around the table at such a spacing therefrom as to permit the desired table displacements.

The second annular cooling structure according to the invention is preferably given the shape of a centrally apertured disc. However, this structure may also be provided with extensions for the purpose of catching any gases or vapors as may issue from gaskets and other sealing means, greased components or other sources. Such extensions, therefore, virtually shade the specimen or the interspaces leading to the specimen against any such sources of soilage.

The invention will be further described with reference to an embodiment illustrated on the accompanying drawing by way of example. Shown on the drawing is an objective lens system of an electron microscope. It should be understood, however, that the invention is not limited to electron microscopes but is also applicable with other corpuscular-ray apparatus such as ion microscopes or diffraction devices, namely in any type of ray apparatus in which a specimen is investigated and soiling of the specimen is to be avoided.

On the drawing there is shown an electromagnetic lens generally of the type known from the above-mentioned patents. The energizing winding 1 induces a magnetic flux in ferromagnetic components 2 and 3 integral or magnetically joined with each other in the lower, non-illustrated portion of the lens. The flux passes through an upper annular pole shoe 4 and a lower annular pole shoe 5 forming between each other a lens gap 6 in which the electron-optically effective lens field is produced. Located in the lens gap is a cooled annular structure 7 which in this embodiment has the shape of a flat and centrally apertured disc 7. The disc 7 is joined with a cooling rod 8 of good heat-conducting material with which the structure 7 is connected to a cryogenic source vessel 40 filled with liquid air or another liquid gas. This cryogenic source vessel 40 may be located within or without the vacuum vessel (not shown) in which the lens system and the other components of the corpuscular-ray apparatus are located. If desired, however, the cryogenic medium itself may be placed into contact with the cooled annular structure 7. The non-illustrated details are not essential to the invention proper and well known as such.

The upper pole shoe and the lower pole shoe have respective apertures which jointly form the lens bore. A specimen cartridge 10 is shown protruding with its bottom end into the aperture 9 of the upper pole shoe 4. The specimen itself is mounted on a specimen carrier 11 designed as a diaphragm. In the illustrated example the diaphragm is composed of a number of legs or spider arms 12 and 13 so that the specimen is held freely floating within the lens aperture 9.

The specimen cartridge 10 is inserted into a table 14 which for this purpose is provided with a conical opening 15 matching the shape of the cartridge top portion.

The table 14 is displaceable in directions transverse to the ray axis A of the lens system, the displacement being effected by actuating means (not shown) passing vacuum-tightly through the vessel wall of the apparatus to the outside, such tables and appertaining displacement control means being known as such.

Essential to the invention is the cooled annular structure 7 in the lens gap. This structure, particularly on account of its inner peripheral surface area 16, provides for the desired prevention or reduction of specimen soiling. To give the cooled surface area 16 a largest feasible size without unduly increasing the lens gap 6, the surface area 16 is profiled by a peripheral groove 17 machined into the structure.

For the same purpose, small interspaces 18 and 19 are provided between the annular cooling structure 7 on the one hand and the two pole shoes 4 and 5 on the other hand. The upper transverse surface area 7a of the structure 7 is given a profile, for example with the aid of machined grooves 17a, likewise for increasing the effective cooling area.

To indicate that the profiles 17a and 17 are optional, they are omitted in the left-hand portion of the illustration.

A second annular cooling structure 20 is mounted above the adjusting table 14 and above the specimen cartridge 10 when the latter is properly inserted into the table as shown. A second annular cooling structure 20 is mounted on the first cooling structure 7 by means of vertical holding pins 21 and 22 of good heat-conducting material. Consequently, the second cooling structure 20 is connected by the cooling rod 8 with the same cryogenic source 40 as the first cooling structure 7 located within the lens gap. The second cooling structure 20 has a center opening 23 of a sufficiently large diameter to permit not only the passage of the electron beam along the axis A but also the insertion and removal of the cartridge 10 with the specimen.

The interspace 24 between the second cooling structure 20 and the table 14 is kept as small as feasible so that this interspace constitutes a large suction impedance for any hydrocarbon atoms or molecules as may still be contained in the vacuum.

In the illustrated embodiment a molecular-sieve material or adsorbent 25 (such as available under the name Zeolith) is provided on the second annular structure at 25 which, if desired, may be provided with a cavity or other recess for accommodating such material. The adsorbent material then augments the retainment of any atoms or molecules as may lead to soiling of the specimens. When using such molecular screening materials, it is in some cases advisable to provide the cooling structure with heating means such as an electric heating winding, to be used for regeneration of the material.

It is sometimes desired to investigate a specimen, at especially low specimen temperatures, without foregoing the protection from soiling afforded by the invention. In such cases a thermally conducting connection, for example a metal mesh or a metal spring, may be provided between the annular cooling structure 7 in the lens gap 6 on the one hand and the specimen carrier 11 on the other hand.

The invention is not limited to the illustrated construction of the specimen cartridge. Applicable, for example, are also cartridges and specimen holders which permit a tilting adjustment of the specimen such as required for the production of stereoscopic images.

It is a particular advantage of the invention that, due to the absence of cooled structural parts in the lens bore 9, the entire diameter of this bore is available for any desired displacements or adjustments of the specimen.

The pole shoe 5 is provided with a diaphragm 26 whose aperture has a very small diameter compared with that of the pole shoe 4. The lower pole shoe 5 is substantially at normal room temperature so that the diaphragm 26 likewise assumes room temperature. Consequently, this diaphragm does not act as a cryopump but only as a very high suction impedance relative to any hydrocarbon molecules which are not supposed to reach the vicinity of the specimen because of their tendency to soil the specimen.

The annular cooling structure 7 may be provided with radial recesses or bores 27 which are available for the passage of actuating or holding means for diaphragms or the like as may be required in the vicinity of the lens gap.

As mentioned, the invention is not limited to providing a cryogenic source outside of the vacuum vessel and connecting this source through the cooling rod 8 with the annular cooling structure 7. The cryogenic medium may also be placed inside the apparatus and may then evaporate in the hollow spaces within the cooling structures 7 and/or 20.

Furthermore, the second annular cooling structure 20 may be directly connected with a cryogenic source or medium, for example by having the cooling rod 8 connected with the structure 20 instead of the structure 7, or providing each of the two annular structures with its own cooling connections.

If desired, the proper spacing of the annular cooling structure 7 from the pole shoe 5 may be secured by interposed spacers of insulating material such as the one shown at 31. Three such spacers, uniformly distributed about the axis A, are sufficient.

The mounting pins 21 and 22 for supporting the second cooling structure 20 are preferably distributed about the table 14 and are radially spaced from the table a sufficient distance to permit transverse displacements of the table in all directions.

The transversely displaceable table 14 is shown provided with several channels extending from the bottom surface facing the objective lens to the top surface, so that the second cooling structure 20 can act through the passages to suck out of the interspace between table and lens any atoms and molecules as may contribute to soiling of the specimen. Such channels may extend substantially parallel to the axis A of the corpuscular beam, or they may be inclined or form a knee if this is required by the driving or adjusting means of the table. In the embodiment exemplified on the drawing, the table 14 is shown to have a channel 37 which extends through the table from top to bottom substantially parallel to the ray axis. At localities where the channel cannot extend in this manner — for example because driving components for moving the specimen, as required for stereo investigations, must pass through the interior of the table—an inclined channel as shown at 38 or a channel 39 or angular configuration may be provided. The cooling effect of the annular cooling structure 20 acts through the channels of the table 14 so that any molecules contained in the interspace beneath the table are drawn out of the interspace in order to precipitate upon the cooling structure 20.

The number of channels depends upon the particular design of the specimen table used, as well as upon the flow impedances existing in the region of the specimen and particularly in the interspace between the table 14 and the objective lens. It is generally favorable to provide a smaller number of large-diameter channels rather than a larger number of channels having a smaller diameter.

To those skilled in the art it will be obvious upon a study of this disclosure that my invention permits of various modifications and may be given embodiments other than particularly illustrated herein, without departing from the essential features of the invention and within the scope of the claims annexed hereto.

I claim:

1. In a charged particle-beam apparatus, a lens device comprising a charged particle-beam lens defining a beam axis and having two centrally apertured lens members formed of magnetic material and axially spaced from each other to form a space therebetween, the apertures of the lens members defining a lens bore, specimen holder means extending axially into the lens bore for holding a specimen therein, a first cooling body situated in said space between said lens members in heat insulating relation to the lens members and extending about the axis in a plane substantially perpendicular to the latter, the first cooling body consisting of non-magnetic material and having a central opening at least substantially equal in diameter to the lens bore so that the first cooling body is prevented from protruding into said lens bore, said central opening being defined by an inner wall of said first cooling body extending axially between the lens members and circumferentially facing said specimen holder means, heat-conductive connecting means for connecting the first cooling body to a cryogenic source, whereby the surface of the first cooling body, when cooled, reduces soiling of the specimen, a second cooling body disposed above said lens, the specimen holder means having a face directed away from the lens, the second cooling body being located adjacent said face of said specimen holder means and being formed with a central opening surrounding the beam axis and having a diameter larger than the specimen holder means and at least as large as the diameter of said lens bore whereby said second cooling body is prevented from protruding into said lens bore, and a second heat-conductive connecting means attached to the second cooling body for communicating with the cryogenic source.

2. A lens device as claimed in claim 1, wherein the respective apertures of the two lens members have respective diameters of unequal size, and the opening of the first cooling body has a diameter at least substantially equal to the larger one of the diameters.

3. A lens device as claimed in claim 1, wherein the inner wall defining the central opening in the first cooling body is formed with at least one peripheral groove for increasing the cooling surface area of the wall.

4. A lens device as claimed in claim 1, wherein the first cooling body forms a flat plate and is spaced in the axial direction from each of the lens members so as to form respective interspaces transverse to the beam axis.

5. A lens device as claimed in claim 1, further comprising an uncooled diaphragm coaxially mounted on one of the lens members and having a central aperture of small diameter compared with the aperture diameter of the other of the lens members.

6. A lens device as claimed in claim 1, wherein the specimen holder means comprises elements for holding the specimen in floating position within the lens-bore space of the lens.

7. A lens device as claimed in claim 1, wherein the first cooling body has transverse bores.

8. A lens device as claimed in claim 1, wherein the second heat-conductive connecting means is adapted for mounting the second cooling body on the first cooling body.

9. A lens device as claimed in claim 1, further comprising adjusting table means for adjusting the position of the specimen transversely of the beam axis, the table having a bore for mounting the specimen holder means and being located intermediate the lens and the second cooling body, the latter being axially spaced from the table means substantially the minimum distance required for transverse displacements.

10. A lens device as claimed in claim 3, wherein the respective apertures of the two lens members have respective aperture diameters, the wall having a plurality of the grooves, the grooves having respective diameters of varying size, the smallest one of the diameters of the grooves being at least substantially equal to the larger one of the aperture diameters.

11. A lens device as claim in claim 4, wherein the first cooling body has, adjacent to the interspaces, a surface configuration departing from straight planar shape so as to provide for an increased cooling-wall area.

12. In a lens device according to claim 9, wherein the second heat-conductive connecting means is adapted for mounting the second cooling body on the first cooling body, the mounting means being distributed about the table means and being transversely spaced therefrom a distance sufficient for permitting the transverse displacements.

13. A lens device according to claim 9, wherein the table has two faces, one of the faces facing the lens and the other face facing the second cooling body, the table having passages extending from the one face to said other face, whereby the cooling effect of the second cooling body extends through the passages into the interspace between the table and the lens.

* * * * *